United States Patent [19]
Kramer, Jr. et al.

[11] Patent Number: 5,230,088
[45] Date of Patent: Jul. 20, 1993

[54] RADIO TRANSCEIVER AND RELATED METHOD OF FREQUENCY CONTROL

[75] Inventors: John W. Kramer, Jr., Allison Park, Pa.; Thomas J. Hutton, Cupertino, Calif.

[73] Assignee: Symbol Technologies, Inc., Bohemia, N.Y.

[21] Appl. No.: 781,925

[22] Filed: Oct. 24, 1991

[51] Int. Cl.[5] .......................... H04B 1/54; H04B 1/40; H04L 27/04; H04L 27/12

[52] U.S. Cl. ........................................ 455/76; 455/84; 455/260; 375/97

[58] Field of Search ............... 375/97, 99, 51; 455/75, 455/76, 77, 84, 85, 86, 113, 118, 119, 120, 256, 260, 264, 265

[56] References Cited

U.S. PATENT DOCUMENTS

| | | |
|---|---|---|
| 4,002,995 | 1/1977 | Reed . |
| 4,086,545 | 4/1978 | Teshirogi . |
| 4,185,240 | 1/1980 | Atkinson et al. . |
| 4,325,140 | 4/1982 | Stitzer ................................. 455/86 |
| 4,373,205 | 2/1983 | Mizota ................................. 455/86 |
| 4,404,685 | 9/1983 | Rogers . |
| 4,568,888 | 2/1986 | Kimura et al. . |
| 4,602,225 | 7/1986 | Miller et al. . |
| 4,618,997 | 10/1986 | Imazeki et al. . |
| 4,663,511 | 12/1986 | Kogo et al. . |
| 4,932,072 | 6/1990 | Toko . |
| 4,942,374 | 7/1990 | Sai . |

*Primary Examiner*—Reinhard J. Eisenzopf
*Assistant Examiner*—Lisa Charouel
*Attorney, Agent, or Firm*—Finnegan, Henderson, Farabow, Garrett & Dunner

[57] ABSTRACT

A radio transceiver for use in data communications uses a single phase-locked loop to control the frequency of the receiver portion while simultaneously providing coarse control of the frequency of the transmitter portion. The output of the receiver portion is also used to provide an error signal for fine tuning the transmitter frequency after the component of the error signal caused by modulation of the transmitter portion has been removed.

17 Claims, 1 Drawing Sheet

RADIO TRANSCEIVER AND RELATED METHOD OF FREQUENCY CONTROL

BACKGROUND OF THE INVENTION

The present invention generally relates to radio transceivers, and more specifically to portable battery-powered radio transceivers for data communications.

The frequency generating section of a radio transceiver typically includes a frequency synthesizer in a phase-locked loop. Although the transceiver transmits and receives on the same channel frequency, the phase-locked loop must provide one frequency for the transmitter portion when the transceiver is in the "transmit" mode and another frequency, offset by the intermediate frequency (IF), when the transceiver is in the "receive" mode. Thus, when the transceiver is switched from the receive mode to the transmit mode, and vice versa, the frequency synthesizer must be reset and the phase-locked loop must regain synchronization.

For a simple phase-locked loop circuit having both high frequency stability and low noise, the response time of the phase-locked loop for regaining synchronization is typically on the order of 10 milliseconds. For data communications applications, however, the transmitter portion of the transceiver must be able to respond much more rapidly. The response time of a simple phase-locked loop is too slow for most data communication applications in which the transmitter must respond in a few hundred microseconds or less.

Phase-locked loops with rapid response times can be constructed, but these circuits are more complex and therefore require additional components and consume more power. This is obviously less desirable for portable transceivers which are battery powered.

SUMMARY OF THE INVENTION

Accordingly, it is the goal of this invention to provide a radio transceiver for use in data communications which uses only a single phase-locked loop for controlling the frequency of both the receiver portion and the transmitter portion while still providing for rapid turn-on and low noise.

To achieve this goal and in accordance with the purpose of the invention, as embodied and broadly described herein, the radio transceiver uses a single phase-locked loop to control the frequency of the receiver portion while simultaneously providing coarse control of the frequency of the transmitter portion. The output of the receiver portion is also used to provide an error signal for fine tuning the transmitter frequency after the component of the error signal caused by modulation of the transmitter portion has been removed.

More specifically, the radio transceiver in accordance with the invention comprises: a phase-locked loop portion; a receiver portion; and a transmitter portion. The phase-locked loop portion of the transceiver provides a stable tuning reference signal to the receiver portion. The phase-locked loop portion includes means for generating a first control signal having an amplitude which is related to a first frequency, and oscillator means, responsive to the first control signal, for generating a reference signal at the first frequency.

The receiver portion has inputs for receiving the reference signal from the phase-locked loop portion and a radio frequency signal at a second frequency different from the first frequency from an external transmission medium, such as an antenna. In a preferred embodiment, the receiver portion operates on the heterodyne principle and mixes the received signal from the antenna with the reference signal to produce an intermediate frequency signal. The receiver portion thereby produces a demodulated output signal from the received radio frequency signal.

The transmitter portion has an output coupled to the external transmission medium for transmitting a radio frequency signal at the second frequency. The transmitter portion includes means for generating a second control signal having an amplitude which is approximately linearly related to both the first control signal and the demodulated output signal from the receiver portion, and a second oscillator means, responsive to the second control signal, for generating the radio frequency signal to be transmitted at the second frequency.

In a preferred embodiment of the invention, the radio frequency signal output of the transmitter portion is modulated with a data transmission signal. In order to remove noise caused by the data transmission signal from the demodulated output signal from the receiver portion, the transmitter portion also includes means for subtracting a scaled amount of the transmission data signal from the demodulated output signal.

It is to be understood that both the foregoing general description and the following detailed description are exemplary and explanatory only and are not restrictive of the invention as claimed. The accompanying drawing, which is incorporated in and constitutes a part of the specification, illustrates an embodiment of the invention and together with the general description, serves to explain the principles of the invention.

DESCRIPTION OF THE PREFERRED EMBODIMENT

Figure 1:
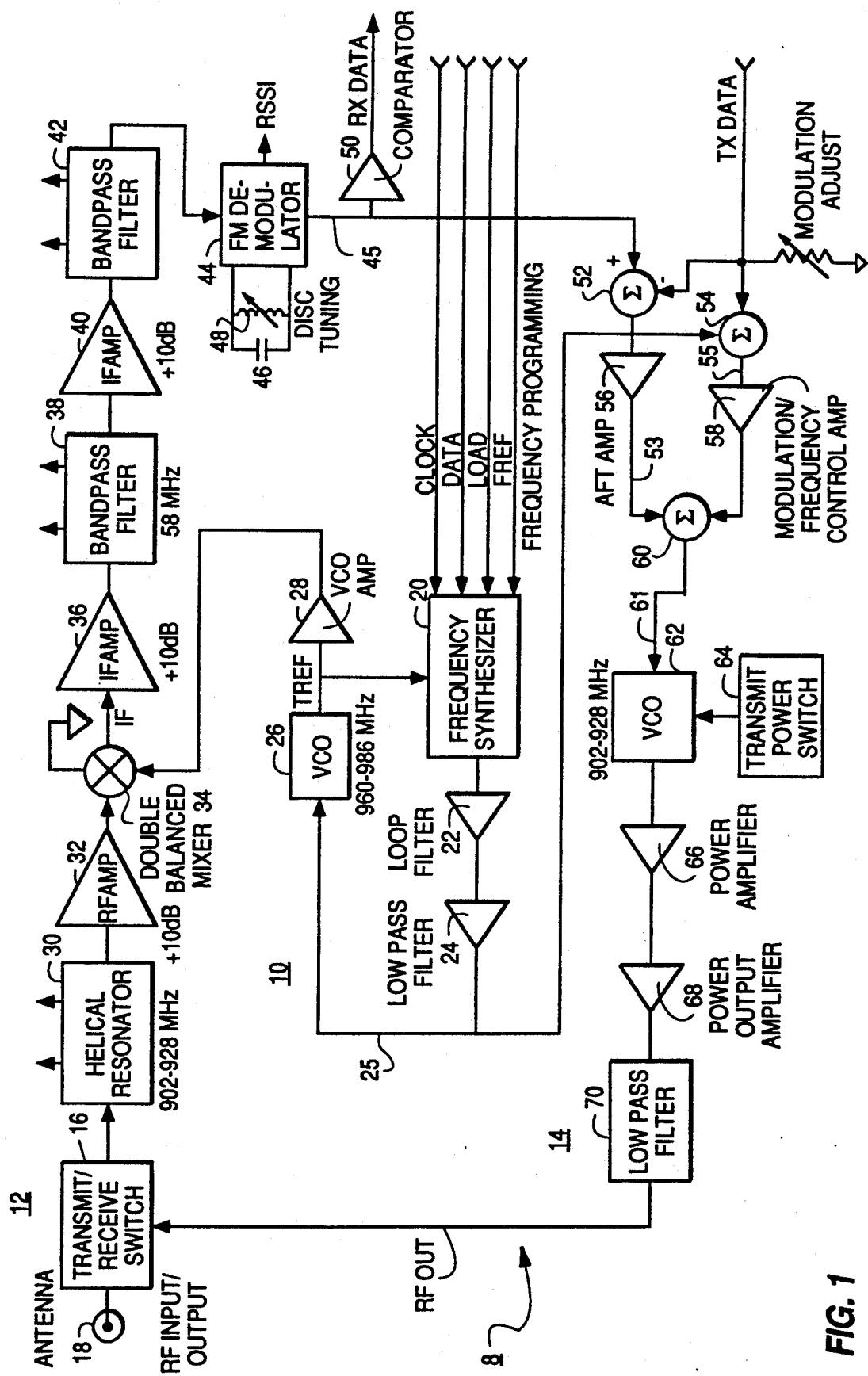
FIG. 1 is schematic block diagram of the presently preferred embodiment of a radio transceiver of the invention.

Referring now to the presently preferred embodiment of the invention, which is illustrated in the accompanying drawing of FIG. 1, a radio transceiver 8 includes a phase-locked loop portion 10, a receiver portion 12, and a transmitter portion 14.

Phase-locked loop portion 10 provides a stable tuning reference frequency to the receiver portion of the transceiver and includes a frequency synthesizer 20, a loop filter 22, a low pass filter 24, a voltage-controlled oscillator (VCO) 26, and a VCO amplifier 28. Although the receiver portion and the transmitter portion both operate on the same channel frequency, the receiver portion requires a tuning reference frequency offset from the channel frequency by an amount equal to an intermediate frequency (IF) of the receiver portion. Where the IF is 58 MHz, for example, the tuning reference frequency will be set at 58 MHz above the channel frequency. Thus, if the channel frequency is 902 MHz, the tuning reference frequency will be set at 960 MHz.

The frequency of operation of phase-locked loop portion 10 is determined by data loaded into frequency synthesizer 20 and by an external reference frequency signal FREF. Frequency synthesizer 20 may be one of several commercially available devices such as, for example, a Fujitsu MB1501 frequency synthesizer. Additional control signals CLOCK, DATA, and LOAD are used to set internal dividers of frequency synthesizer 20 for scaling the frequency of both the output of VCO 26 and the external reference frequency signal FREF. Frequency synthesizer 20 also includes an internal phase detector which compares the scaled output of VCO 26 and FREF. The output of the phase detector is an error signal whose amplitude represents the difference between the two signals.

Loop filter 22 and low pass filter 24 shape the output signal of frequency synthesizer 20 to remove AC components and to provide a DC control signal 25 to drive VCO 26. In response to control signal 25, VCO 26 generates a tuning reference frequency TREF, which is 58 MHz above the channel frequency. Signal TREF is fed back to frequency synthesizer 20 to complete the loop. An amplifier 28 also amplifies signal TREF output from VCO 26 for use in the receiver portion of the transceiver.

As embodied herein, receiver portion 12 of the radio transceiver includes a helical resonator 30, an RF amplifier 32, a double-balanced mixer 34, intermediate frequency amplifiers 36 and 40, bandpass filters 38 and 42, an FM demodulator 44, and a comparator 50. Receiver portion 12 operates on the heterodyne principle by converting a radio frequency signal received by resonator 30 from an external transmission medium, such as an antenna, to the intermediate frequency (IF). In the receive mode, a transmit/receive switch 16 connects the input of receiver portion 12 (i.e., helical resonator 30) to an antenna 18 so that receiver portion 12 receives the radio frequency signal at the channel frequency from the antenna 18. The received signal is mixed with tuning reference frequency TREF from phase-locked loop portion 10 to produce the IF signal. The IF signal is then filtered and demodulated to obtain a received data output signal representing the information received by the receiver portion.

More particularly, helical resonator 30 first filters the received radio frequency signal from antenna 18 to the frequency range of the receiver portion, which in this embodiment is 902 to 928 MHz. RF amplifier 32 amplifies the filtered radio frequency signal for input to double-balanced mixer 34. Double-balanced mixer 34 converts the received radio frequency signal to a single intermediate frequency (IF) signal by mixing the received radio signal with tuning reference frequency TREF signal from phase-locked loop portion 10. The IF signal from double-balanced mixer 34, which is the difference between the received radio frequency signal and tuning reference frequency TREF, is then amplified and filtered by IF amplifiers 36 and 49 and bandpass filters 38 and 42, respectively.

The IF signal is demodulated by FM demodulator 44 to obtain the data output signal. Demodulator 44 may be a commercially-available device such as, for example, a Motorola 13055 FM demodulator, which is connected to discrete tuning elements such as a capacitor 46 and an inductor 48. Demodulator 44 has two output signals, one of which is a data output signal 45 and the other of which is a signal RSSI which indicates the strength of the received signal. A comparator 50 converts the demodulated data output signal 45, which is an analog signal, to a digital data signal RXDATA for use in data communications applications.

As further embodied herein, transmitter portion 14 of the transceiver is a frequency-modulated radio transmitter which transmits a radio frequency signal RFOUT at the channel frequency. This radio frequency signal is modulated by a transmission data signal TXDATA representing the information to be transmitted. The frequency of signal RFOUT is accurately set by a VCO 62 using a control signal 61 which is derived from control signal 25 of phase-locked loop portion 10 and from demodulated data output signal 45 from receiver portion 12, as will be explained in further detail below.

Like the input of receiver portion 12, the output of transmitter portion 14 is connected to the external transmission medium, such as antenna 18, by transmit/receive switch 16. When the transceiver is operating in the transmit mode, the output of transmitter portion 14 is connected to antenna 18. In addition, since it is difficult if not impossible to completely isolate the transmitter output from the receiver input, some of the output signal RFOUT from transmitter portion 14 is coupled into the input of receiver portion 12.

The frequency control of transmitter portion 14 takes advantage of the fact that the respective control voltages 25 and 61 for VCO's 26 and 62 in the transmitter and receiver portions are approximately linearly related. Thus, control signal 25 from phase-locked loop portion 10 can be used to set the frequency of transmitter portion 14 within a few MHz. As shown in FIG. 1, control signal 25 which is input to VCO 26 is also input to VCO 62, after it has been scaled and modulated.

Specifically, control signal 25 from phase-locked loop portion 10 is input to a summation element 54, which may be a simple resistor summing network. The amplitude of control signal 25 is then scaled by an amplifier 58 before it is input to VCO 62. Control signal 25 from phase-locked loop portion 10 thus provides a coarse control of the transmit frequency of transceiver 8 and sets the output of VCO 62 to within a few MHz of the desired channel frequency.

Fine control of the transmit frequency is provided by demodulated data output signal 45 from FM demodulator 44 of receiver portion 12. As noted above, in the transmit mode, some of the output signal RFOUT from transmitter portion 14 is coupled, via switch 16, into the input of receiver portion 12. This causes demodulator 44 to generate a demodulated output signal which constitutes an error signal indicating the difference between the frequency of signal RFOUT and the channel frequency. The demodulated data output signal 45 is scaled by an automatic fine tuning (AFT) amplifier 56 and algebraically summed with the output signal from amplifier 58 by summation element 60 to adjust VCO 62 to the desired channel frequency.

Whenever the transmitter portion of the transceiver is turned on, the transmit frequency will be close to the desired channel frequency. Because the phase-locked loop portion has already achieved lock prior to turning on the transmitter portion, the turn-on time of the transmitter portion is not limited by the timing constraints of the phase-locked loop. Once the transmitter portion begins transmitting, the feedback loop through the receiver portion rapidly pulls the transmit frequency into the center of the channel frequency.

This arrangement generally works well until modulation is introduced to the transmitted signal. In particular, a transmission data signal TXDATA, representing information to be transmitted, is algebraically summed with control signal 25 to produce a modulation control signal 55. This modulation control signal 55 is then input to amplifier 58 in order modulate the transmitter frequency.

The modulation of control signal 25 results in the transmission data signal TXDATA appearing at the output 45 of demodulator 44. AFT amplifier 56 accordingly treats this signal as a frequency error and acts to eliminate this signal. This in turn may cause a noisy transmitted signal and a reduction in transmitted signal deviation at lower modulation frequencies. Therefore, to prevent this noise and modulation reduction, a scaled amount of the transmission data signal TXDATA is subtracted from the signal 45 in summation element 52 to produce an error control signal 53. The error control signal 53 from summation element 52 and the modulation control signal 55 from summation element 54 are then combined in summation element 60 to produce control signal 61 for controlling VCO 62.

Finally, when radio transceiver 8 is in the receive mode, the transmitter portion 14, including VCO 62, is turned off. Preferably, the transceiver is battery powered, so that a transmit power switch 64 supplies battery potential to transmitter portion 14 and VCO 64 only in the transmit mode when the transmitter portion is turned on. In the transmit mode, power amplifiers 66 and 68 amplify the transmitter output signal and low pass filter 70 eliminates any higher frequency harmonics. The output of transmitter portion 14 is then connected to antenna 18 for transmitting the transmitter output signal RFOUT.

It will be apparent to those skilled in the art that various modifications and variations can be made in the radio transceiver of the present invention without departing from the scope or spirit of the invention. Other embodiments of the invention will be apparent to those skilled in the art from consideration of the specification and practice of the invention disclosed herein. It is intended that the specification be considered as exemplary only, with a true scope and spirit of the invention being indicated by the following claims.

What is claimed is:

1. A radio transceiver, comprising:
   a phase-locked loop portion including:
      means for generating a first control signal having an amplitude which is related to a first frequency, and
      first oscillator means, responsive to the first control signal, for generating a reference signal at the first frequency;
   a radio receiver portion having inputs for receiving the reference signal from the phase-locked loop portion and a radio frequency signal at a second frequency different from the first frequency from an external transmission medium, the receiver portion producing a demodulated output signal from the received radio frequency signal; and
   a radio transmitter portion having an output coupled to the external transmission medium for transmitting a radio frequency signal at the second frequency, the transmitter portion including:
      means for generating a second control signal having an amplitude which is approximately linearly related to both the first control signal and the demodulated output signal, and
      second oscillator means, responsive to the second control signal, for generating the radio frequency signal to be transmitted at the second frequency.

2. The radio transceiver of claim 1, wherein the transmitter portion further includes:
   means for modulating the second control signal with a transmission data signal, and
   means for subtracting a scaled amount of the transmission data signal from the demodulated output signal.

3. The radio transceiver of claim 1, wherein the means for generating the second control signal includes:
   means for adding a transmission data signal to the first control signal to produce a modulation control signal,
   means for subtracting a scaled amount of the transmission data signal from the demodulated output signal to produce an error control signal, and
   means for combining the modulation control signal and the error control signal to produce the second control signal.

4. The radio transceiver of claim 1, wherein the transceiver selectively operates in one of a transmit mode and a receive mode, the transceiver further comprising:
   switching means for connecting the transmitter portion to the external transmission medium at times when the transceiver is operating in the transmit mode, whereby the external transmission medium transmits the radio frequency signal at the second frequency from the transmitter portion, and for connecting the external transmission medium to the receiver portion at times when the transceiver is operating in the receive mode, whereby the receiver portion receives from the external transmission medium the received radio frequency signal at the second frequency.

5. The radio transceiver of claim 4, wherein the output of the transmitter portion is coupled to the input of the receiver portion through the switching means at times when the transceiver is operating in the transmit mode.

6. The radio transceiver of claim 1, wherein the receiver portion includes:
   means for mixing the reference signal and the received radio frequency signal from the external transmission medium to produce an intermediate frequency signal, and
   means for demodulating the intermediate frequency signal to produce the demodulated output signal.

7. A radio transceiver, comprising:
   a phase-locked loop portion including:
      means for generating a first control signal having an amplitude which is related to a first frequency, and
      first oscillator means, responsive to the first control signal, for generating a reference signal at the first frequency;
   a radio receiver portion having inputs for receiving the reference signal from the phase-locked loop portion and a radio frequency signal at a second frequency different from the first frequency from an external transmission medium, the receiver portion producing a demodulated output signal from the received radio frequency signal; and
   a frequency-modulated radio transmitter portion having an output coupled to the external transmission medium for transmitting a radio frequency signal at the second frequency modulated by a transmission data signal, the transmitter portion including:
      means for subtracting a scaled amount of the transmission data signal from the demodulated output signal to produce an error signal,
      means for generating a second control signal having an amplitude which is approximately linearly related to both the transmission data signal and the error signal, and
      second oscillator means, responsive to the second control signal, for generating the radio frequency signal to be transmitted at the second frequency.

8. The radio transceiver of claim 7, wherein the transceiver selectively operates in one of a transmit mode and a receive mode, the transceiver further comprising:
switching means for connecting the transmitter portion to the external transmission medium at times when the transceiver is operating in the transmit mode, whereby the external transmission medium transmits the radio frequency signal at the second frequency from the transmitter portion, and for connecting the external transmission medium to the receiver portion at times when the transceiver is operating in the receive mode, whereby the receiver portion receives from the external transmission medium the receiver radio frequency signal at the second frequency.

9. The radio transceiver of claim 8, wherein the output of the transmitter portion is coupled to the input of the receiver portion through the switching means at times when the transceiver is operating in the transmit mode.

10. The radio transceiver of claim 7, wherein the receiver portion includes:
means for mixing the reference signal and the received radio frequency signal from the external transmission medium to produce an intermediate frequency signal, and
means for demodulating the intermediate frequency signal to produce the demodulated output signal.

11. A radio transceiver, comprising:
a phase-locked loop portion including:
a frequency synthesizer for generating a first control signal having an amplitude which is related to a first frequency, and
a voltage-controlled oscillator, coupled to the frequency synthesizer and responsive to the first control signal, for generating a reference signal at the first frequency;
a radio receiver portion having inputs to receive the reference signal from the phase-locked loop portion and a radio frequency signal at a second frequency different from the first frequency from an antenna, the receiver portion including:
a mixer for combining the reference signal and the received radio frequency signal from the antenna to produce an intermediate frequency signal, and
a demodulator for demodulating the intermediate frequency signal to produce a demodulated output signal; and
a frequency-modulated radio transmitter portion having an output for transmitting a radio frequency signal through the antenna at the second frequency, the transmitter portion including:
means for adding a transmission data signal to the first control signal to produce a modulation control signal,
means for subtracting a scaled amount of the transmission data signal from the demodulated output signal to produce an error control signal,
means for combining the modulation control signal and the error control signal to produce a second control signal, and
a voltage-controlled oscillator, responsive to the second control signal, for generating the radio frequency signal to be transmitted at the second frequency.

12. The radio transceiver of claim 11, wherein the transceiver selectively operates in one of a transmit mode and a receive mode, the transceiver further comprising
switching means for connecting the transmitter portion to the antenna medium at times when the transceiver is operating in the transmit mode, whereby the antenna transmits the radio frequency signal at the second frequency from the transmitter portion, and for connecting the antenna to the receiver portion at times when the transceiver is operating in the receive mode, whereby the receiver portion receives from the antenna the received radio frequency signal at the second frequency.

13. The radio transceiver of claim 12, wherein the output of the transmitter portion is coupled to the input of the receiver portion through the switching means at times when the transceiver is operating in the transmit mode.

14. In a radio transceiver including a phase-locked loop portion, a receiver portion, and a transmitter portion, a method of controlling the frequency of the transmitter portion comprising the steps of:
generating in the phase-locked loop portion a first control signal having an amplitude which is related to a first frequency;
generating in the phase-locked loop portion a reference signal at the first frequency in response to the first control signal;
producing in the receiver portion a demodulated output signal from a received radio frequency signal at a second frequency different from the first frequency and from the reference frequency from the phase-locked loop portion;
generating in the transmitter portion a second control signal having an amplitude which is approximately linearly related to both the first control signal and the demodulated output signal from the receiver portion; and
generating in the transmitter portion a radio frequency signal to be transmitted at the second frequency in response to the second control signal.

15. The method of claim 14, further comprising the steps of:
modulating the second control signal with a transmission data signal; and
subtracting a scaled amount of the transmission data signal from the demodulated output signal.

16. The method of claim 14, wherein the step of generating the second control signal includes the sub-steps of:
adding a transmission data signal to the first control signal to produce a modulation control signal;
subtracting a scaled amount of the transmission data signal from the demodulated output signal to produce an error control signal; and
combining the modulation control signal and the error control signal to produce the second control signal.

17. The method of claim 14, wherein the step of producing the demodulated output signal includes the sub-steps of:
mixing the reference signal and the received radio frequency signal from an external transmission medium to produce an intermediate frequency signal; and
demodulating the intermediate frequency signal to produce the demodulated output signal.

* * * * *